United States Patent [19]

Takatori et al.

[11] Patent Number: 4,833,691
[45] Date of Patent: May 23, 1989

[54] LINE EQUALIZER

[75] Inventors: Hiroshi Takatori; Osamu Matsuhara, both of Kokubunji; Seiichi Yamano, Yokosuka, all of Japan

[73] Assignees: Hitachi, Ltd., Tokyo; Nippon Telegraph and Telephone Corporation, Chiyoda, both of Japan

[21] Appl. No.: 149,021

[22] Filed: Jan. 27, 1988

[30] Foreign Application Priority Data

Feb. 27, 1987 [JP] Japan ................... 62-42880

[51] Int. Cl.$^4$ .................. H03H 7/075; H04B 3/04
[52] U.S. Cl. ........................... 375/14; 333/18; 333/173
[58] Field of Search ............ 375/12, 14; 333/18, 333/173; 332/31 R

[56] References Cited

U.S. PATENT DOCUMENTS 4,283,788  8/1981  Tamburelli ............... 375/14
4,476,491 10/1984  Murata et al. ............ 375/14
4,547,888 10/1985  Ryan et al. .............. 375/14
4,607,231  8/1986  Makayama ............... 333/173

OTHER PUBLICATIONS

IEEE. ISSCC Proc 1985, p. 150.
IEEE, Journal of Solid-State Circuits, vol. SC=17, No. 6, Dec. 1982, pp. 1045-1054.

*Primary Examiner*—Benedict V. Safourek
*Attorney, Agent, or Firm*—Pennie & Edmonds

[57] ABSTRACT

A line equalizer for eliminating a precursor interference component and postcursor interference components from a pulse signal inputted from a transmission line. A precursor equalizer takes a sum of a signal derived from the input pulse signal retarded by a fundamental period and a signal derived from the input pulse signal multiplied by a coefficient a. A decision circuit decides the threshold level of an output pulse signal from the precursor equalizer to output a predetermined signal. A controller controls the coefficient a of the precursor equalizer on the basis of the signal from the decision circuit, etc.

3 Claims, 7 Drawing Sheets

LINE EQUALIZER

BACKGROUND OF THE INVENTION

1. FIELD OF THE INVENTION

This invention relates to a line equalizer and, particularly, to a line equalizer suitable for use in a digital transmission system in which the precursor appearing before one time slot T ($T=1/f_b$, where $f_b$ is data transmission frequency) of the main pulse is pronounced due to distortion.

2. DESCRIPTION OF THE RELATED ART

In a system implementing digital transmission at a symbol rate of 100 kb/s or higher using a usual pair cable, a $\sqrt{f}$ equalizer having characteristics opposite to the pair cable is installed. However, due to the disparity of lines and the presence of bridged taps (open-ended branch lines), the waveform is distorted, and the intersymbol interference arises at the front and end of the most desirable decision instance (usually, the time point when the response waveform is maximum). The intersymbol interference after the decision instance is compensated by means of a conventional equalizer, e.g., automatic dicision feedback equalizer.

As a precursor equalizer for nullifying the precursor which is an interference component arising before the decision instance, especially before the time slot, there is known an equalizer which yields an equalized waveform without precursor through the process of retarding the input signal by one time slot T of the digital signal and adding the signal to the input signal which is inverted and amplified to the extent equal to the degree of the precursor. (Refer to IEEE, ISSCC Proc. 1985, p. 150 and IEEE, Journal of Solid-State Circuits, Vol. SC=17, No. 6, Dec. 1982, pp. 1045-1054).

The above-mentioned conventional equalizer for eliminating the precursor necessitates an analog delay line, polarity inverting circuit and analog multiplier, resulting in an increased manufacturing cost when it is intended to fabricate on LSI basis, and yet provides unsatisfactory characteristics.

SUMMARY OF THE INVENTION

A prime object of this invention is to provide a line equalizer which allows LSI fabrication and is operable to eliminate a precursor component accurately.

Another object of this invention is to provide a line equalizer consisting in combination of a line equalizer for eliminating a precursor component and a line equalizer for eliminating postcursor components, which is simplified in circuit arrangement and yet practical in operation.

In order to achieve the above objectives, the inventive line equalizer is made up in a serial connection of a pre-equalizing filter for eliminating the precursor and an automatic decision feedback equalizer for eliminating the postcursor, and the pre-equalizing filter having a transfer function of $z^{-1}-a$ (where $z^{-1}=e^{-ST}$, a is a coefficient smaller than 1 and T is a fundamental period of digital signal) is constituted by a single operational amplifier and "switched capacitors" including several capacitors and switches for connecting the capacitors selectively in response to the clock signals.

Preferably, the residual equalizing error, which is an internal signal of the automatic decision feedback equalizer, is retarded by T and multiplied with the decision data so that the transfer function (particularly, the coefficient a) of the equalizing filter is set in accordance with the value of the resulting product.

The invention realizes a line equalizer for eliminating the precursor using a simple switched capacitor circuit, and also realizes an accurate LSI-based line equalizer.

These and other objects and features of this invention will become more apparent from the following detailed description taken in conjunction with the accompanying drawings.

DESCRIPTION OF THE PREFERRED EMBODIMENTS

Figure 1:
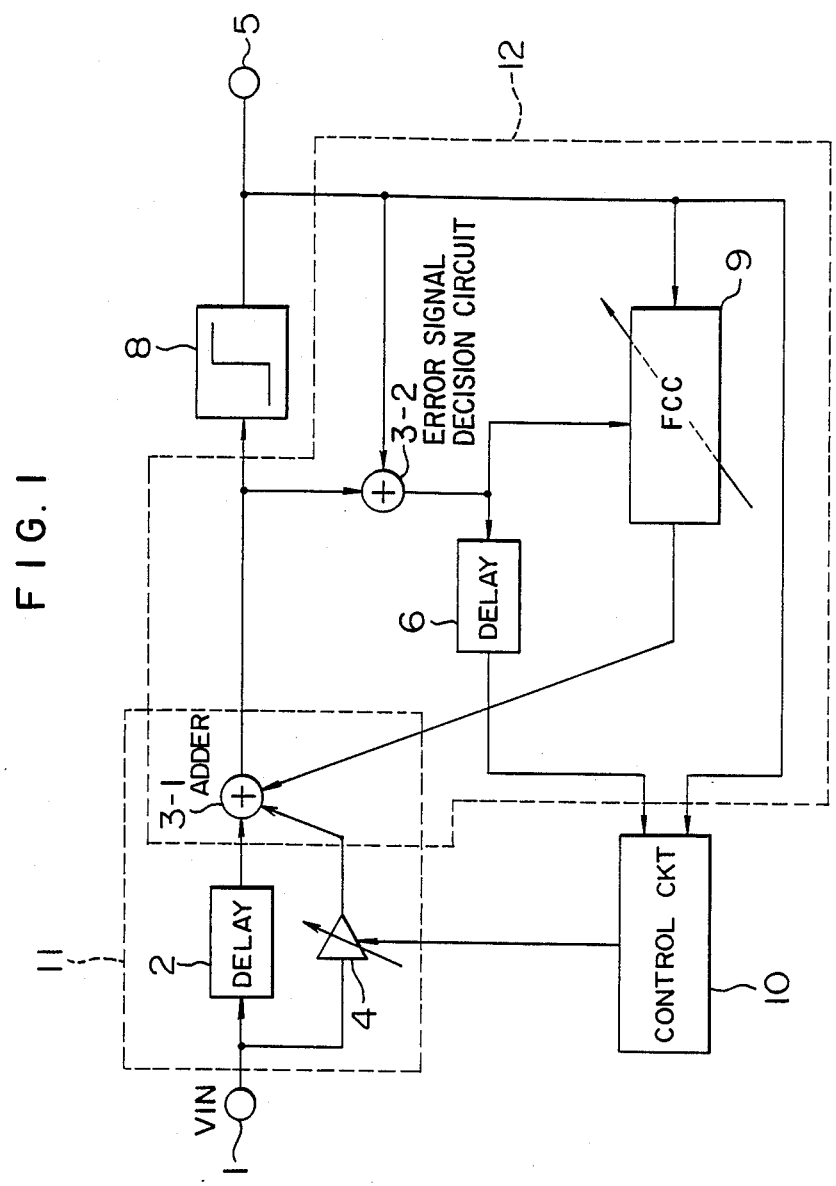
FIG. 1 is a block diagram of the line equalizer embodying the present invention.

FIG. 1 shows the arrangement of an embodiment of this invention, which is the combination of a line equalizer and a decision circuit. In the figure, an input terminal 1 receives a digital signal $V_{IN}$ which has been equalized with a $\sqrt{f}$ equalizer (not shown). The input signal undergoes line equalization with a precursor equalizer (filter) 11 and a decision feedback equalizer 12 so that the pre-intersymbol interference component and post-intersymbol interference component are eliminated, the digital signal is decided, and the decided digital value is delivered to an output terminal 5. In this embodiment, the precursor equalizer 11 and decision feedback equalizer 12 have their adders constituted by a common adder 3-1.

The precursor equalizing filter 11 consists of a delay element 2 which retards the input signal $V_{IN}$ by time T, a coefficient multiplier 4 which multiplies the input signal with a coefficient a, and an adder 3-1 which sums the outputs of the delay element 2 and multiplier 4.

The decision feedback equalizer 12 consists of an error signal decision circuit 3-2 which produces a residual equalizing error signal from the input and output signals of the decision circuit 8, a first control circuit 9 which receives the residual equalizing error signal and the output of the decision circuit to produce a postcursor signal, and an adder (the common adder 3-1) which subtracts the postcursor signal from the output of the precursor equalizing filter. The arrangement of the automatic decision feedback equalizer 12 is identical to a conventional one.

The an error signal decision circuit 3-2 provides the residual equalizing error, which is applied to the first control circuit 9 and also, after being retarded by time T by the delay element 6, applied to a second control circuit 10. The control circuit calculates the product of the residual equalizing error and the decision data from the decision circuit 8 8, and varies the coefficient a of the multiplier 4 in the precursor equalizing filter 11.

Figure 2:
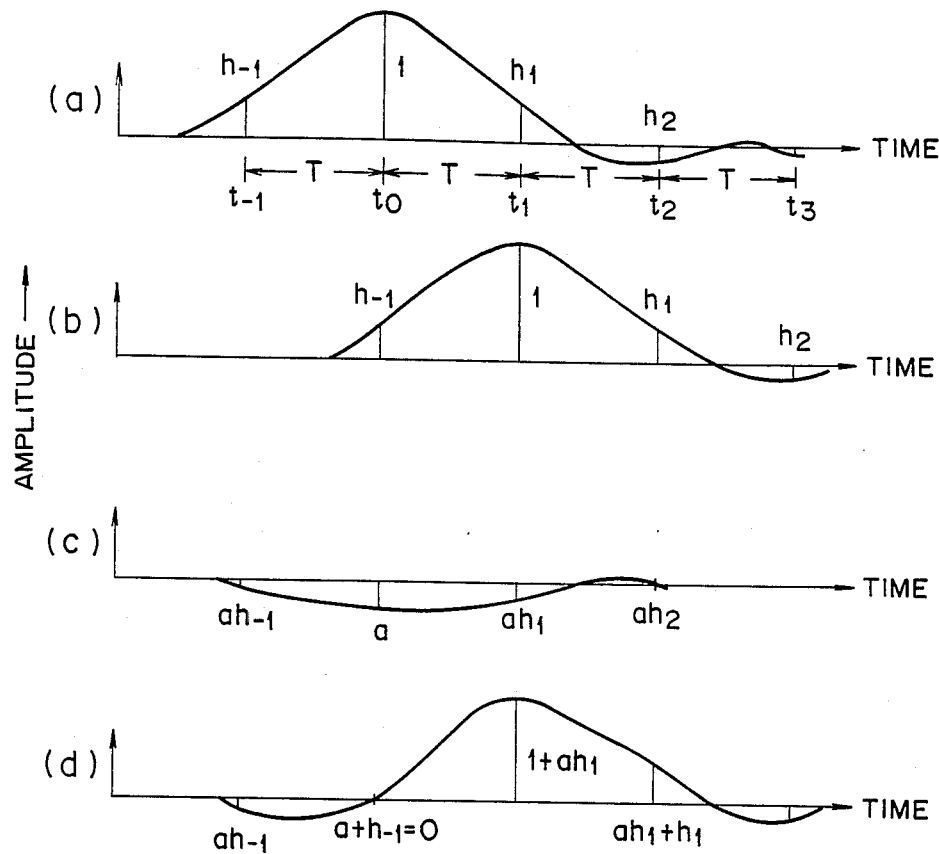
FIG. 2 is a waveform diagram explaining the precursor eliminating operation by the line equalizer shown in FIG. 1.

FIG. 2 is a waveform diagram used to explain the operation of the precursor equalizer, in which shown by (a) is the digital signal applied to the input terminal 1. Although the digital signal shown is a single pulse for the sake of explanation, it actually has a superimposed waveform derived from signals having the waveform of (a) spaced out by integral multiples of the transmission period T of the digital signal.

The waveform of (a) is the result of equalization by the $\sqrt{f}$ equalizer, but due to the disparity of characteristics of lines and the influence of open-ended branch lines (bridged taps), it includes interference components as shown by hn between the decision instance $t_0$ (virtually coincident with the peak of the waveform) and time points nT (n is an positive and negative integer). The $h_1$, $h_2$ and so on after the time point $t_0$ are called "postcursors" and they are compensated by the feedback equalizer.

The $h_{-1}$ arising before the decision instance $t_0$ is called "precursor" and it is eliminated by the precursor equalizer 11. In order to remove the precursor $h_{-1}$, the input pulse signal (a) is retarded by one time slot T by means of the delay element 2, resulting in a waveform shown by (b). A signal (c) having an amplitude (a) equal to the precursor $h_{-1}$ and having its polarity inverted is produced by the coefficient multiplier 4, and it is added to the signal (b) by the adder 3-1, resulting in a waveform (d) after precursor equalization. This waveform can have interference nullified at the time point $t_0$.

Figure 3:
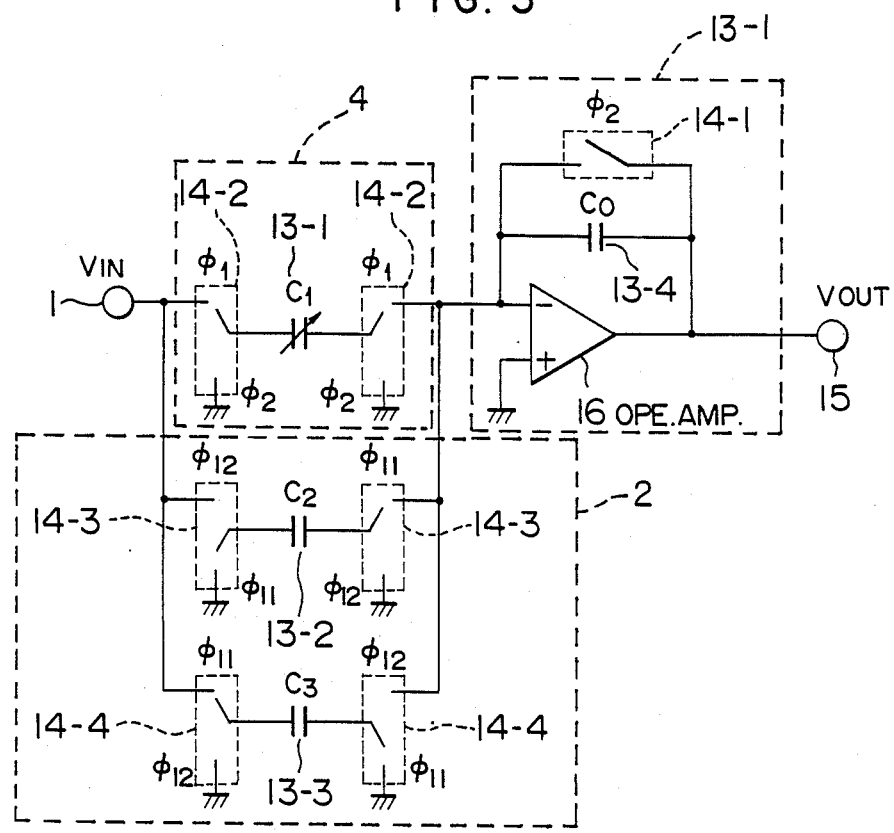
FIG. 3 is a schematic diagram of the preequalizing filter embodying the present invention.
Figure 4:
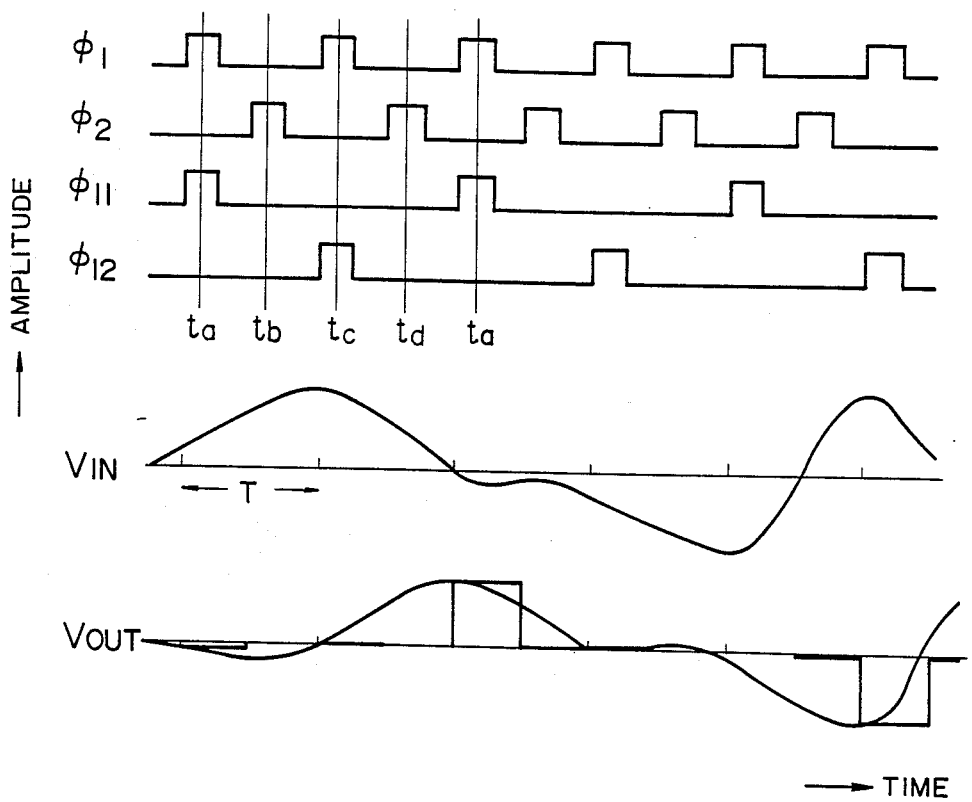
FIG. 4 is a waveform diagram showing the clock signals and input and output voltages in the circuit shown in FIG. 3.

FIG. 3 shows the circuit arrangement of the above-mentioned precursor equalizing filter 11 according to an embodiment of this invention, and FIG. 4 shows in timing chart the operation of the foregoing embodiment. As shown in FIG. 3, the precursor equalizing filter 11 includes an operational amplifier 16 having its positive input terminal grounded and having a parallel connection of a first switched capacitor (having capacitance $C_0$) 13-14 and a first switch 14-1 between its negative input terminal and output terminal 15, and a second, third and fourth switched capacitors 13-1, 13-2 and 13-3 having capacitances $C_1$, $C_2$ and $C_3$, respectively, connected in parallel between the input terminal 1 and the negative input terminal. Provided at both ends of the second, third and fourth switched capacitors 13-1, 13-2 and 13-3 are a second switch means 14-2, third switch means 14-3 and fourth switch means 13-4, and they are operated by the first, second, third and fourth clock signals $\phi_1$, $\phi_2$, $\phi_{11}$ and $\phi_{12}$ as shown in FIGS. 3 and 4.

More specifically, the first and second clock signals $\phi_1$ and $\phi_2$ have the same period T and are out of phase with each other. The third and fourth clock signals $\phi_{11}$ and $\phi_{12}$ have the same period 2T and are out of phase with each other and in synchronism with the clock signal $\phi_1$.

At time point $t_a$ in FIG. 4, the second switched capacitor 13-1 is connected between the input terminal 1 and the negative input terminal, the fourth switched capacitor 13-3 is connected between the input terminal 1 and the ground, and the third switched capacitor 13-2 is connected between the negative input terminal and the ground. At time point $t_b$, the second switched capacitor 13-1 has its both terminals grounded so that it is discharged, and the first switch 14-1 is closed so that the first switched capacitor 13-4 is discharged. At time point $t_c$, the first switch 14-1 and second switch 14-2 have the same connection modes as at time point $t_a$, causing the third switched capacitor 13-2 to be connected between the input terminal 1 and the ground and the fourth switched capacitor 13-3 to be connected between the negative input terminal and the ground in respone to the fourth clock signal. At time point $t_d$, all switch means have the same connection modes as at time point $t_b$.

The switched capacitors 13-2 and 13-3 sample the input signal at the transmission period T and, after a delay of T, transfer the charge to the switched capacitor $C_0$ connected with the operational amplifier, which then produces an output of $(C_2/C_0) \cdot Z^{-1} \cdot V_{IN}$ on the output terminal 15.

The second switched capacitor 13-1 provides an output of $(C_1/C_0)V_{IN}$ on the output terminal 15. Assuming the $C_1/C_0$ to be set equal to a in FIG. 2, a voltage equal to the above-mentioned precursor is produced.

Accordingly, the circuit shown in FIG. 3 has a transfer function F expressed as follows.

$$F = \frac{C_2}{C_0} \cdot Z^{-1} - \frac{C_1}{C_0}$$
$$= Z^{-1} - a$$

where $C_0 = C_2 = C_3$, and $C_1/C_0 = a$.

$V_{IN}$ and $V_{OUT}$ in FIG. 4 are the signal waveforms appearing on the input terminal 1 and output terminal 15, respectively, in FIG. 3.

Figure 5:
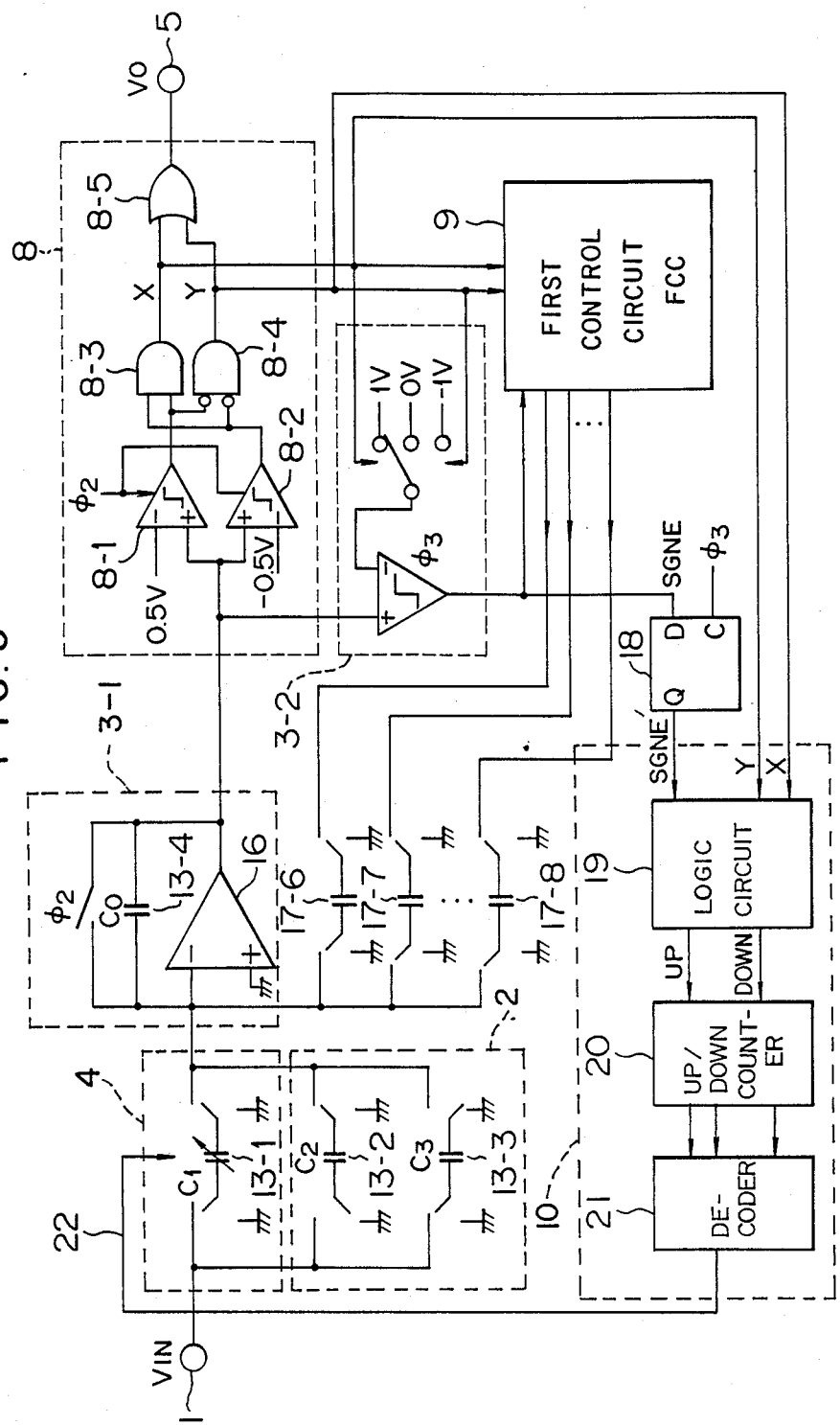
FIG. 5 is a block diagram showing in more detail the circuit arrangement of FIG. 1.
Figure 6:
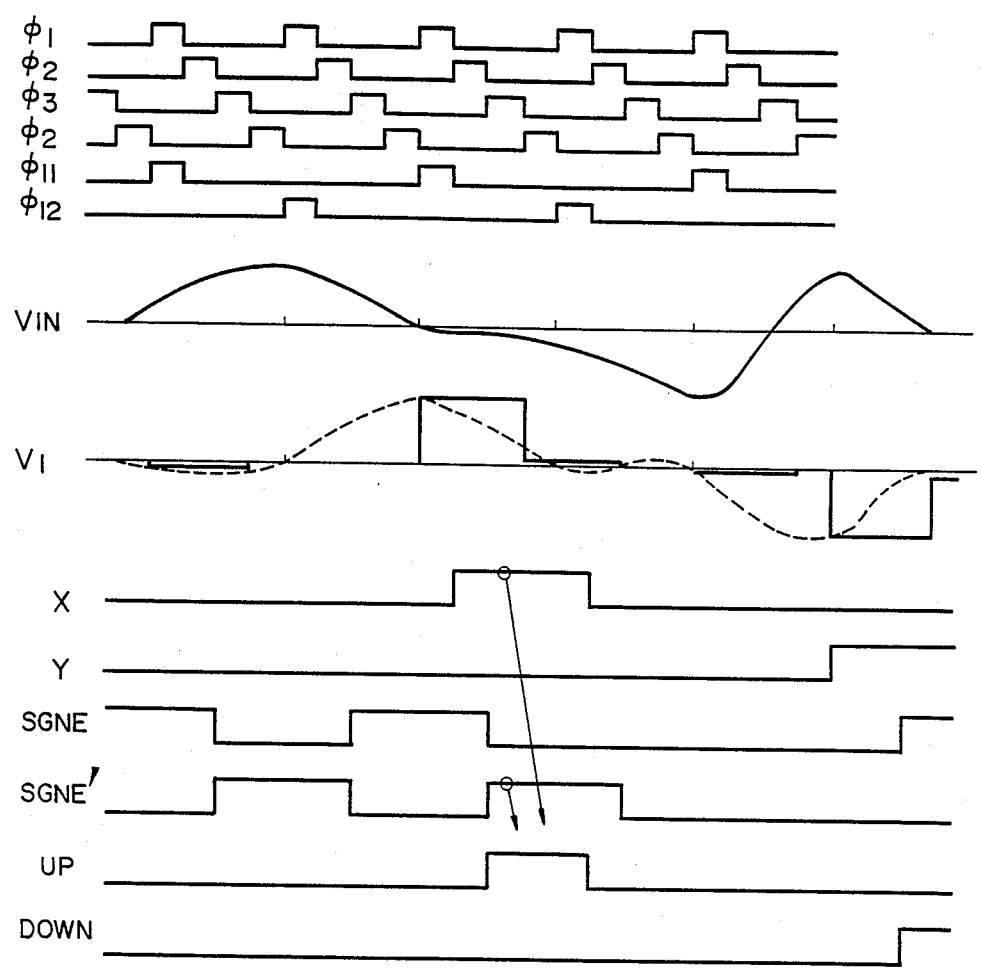
FIG. 6 is a waveform diagram of the signals used to explain the operation of the circuit shown in FIG. 5.
Figure 7:
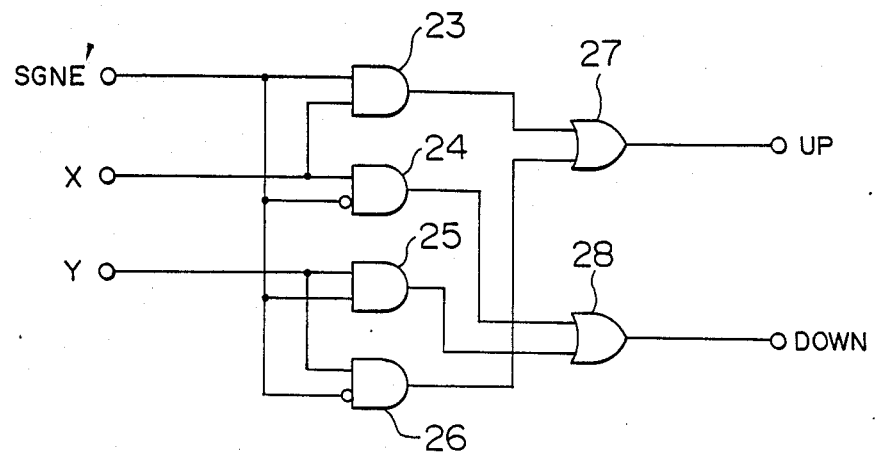
FIG. 7 is a schematic diagram showing an embodiment of the logic circuit 19 in FIG. 5.

FIG. 5 shows in more detail the circuit arrangement of the embodiment shown in FIG. 1. Identical components in FIGS. 1 and 3 have the same reference numbers. In order for the precursor equalizer 11 to share its adder 3-1 with the automatic decision feedback equalizer 12, a plurality of capacitors 17-6, 17-7 and 17-8 are connected at the input of the operational amplifier 16. Moreover, a plurality of capacitors 17-6, 17-7 and 17-8 are connected at the input of the operational amplifier 16 for eliminating the postcursor appearing in period for n×T (n: the number of switched capacitors, T: one time slot of the main pulse). In FIG. 1, the switched capacitor 17 are omitted. This achieves the elimination of the precursor component $h_{-1}$ by the precursor equalizing filter 11 and the elimination of postcursor components ($h_1$, $h_2$, etc.) using a single operational amplifier 16.

The signal $V_{OUT}$, from which the precursor component $h_{-1}$ and postcursor components $h_1$, $h_2$, etc., have been removed, is applied to the decision circuit 8, which is a known circuit configuration dealing with the alternative mark inversion code having three levels of "1", "0" and "−1". Comparators 8-1 and 8-2 have threshold values of 0.5 and −0.5, respectively, with their output values being gated by AND gates 8-3 and 8-4 which yield decided data X and Y. The data X and Y are gated by an OR gate 8-5, which provides a unipolar identification signal.

The first control circuit 9 is a circuit which detects the postcursor components $h_1$, $h_2$, etc. basing on the identification data X and Y and the equalization error signal SGNE from the error signal decision circuit (this signal indicates the polarity of the difference of the signal $V_{OUT}$ after removal of the precursor component $h_1$ from a reference voltage (1 volt, 0 volt or −1 volt) selected by the decision data X (data="1") and Y (data="−1"). The detailed explanation of this well known circuit will be omitted.

Next, the adaptive operation of the switched capacitor 13-1 will be described. The switched capacitor 13-1, as mentioned previously, is to multiply a coefficient a corresponding to the magnitude of precursor $h_{-1}$ of the input digital signal with the input signal, and the level of $h_{-1}$ varies depending on the characteristics of transmission line. The adaptive operation of the switched capacitor 13-1 is to evaluate the coefficient a in correspondence to the variable $h_{-1}$.

The equalization error SGNE produced by the adder 3-2 is retarded by the period T by means of a D-type flip-flop 18, and it is supplied along with the decided data X and Y to a logic circuit 19. The logic circuit 19 takes the correlation between the decided data X and Y and the equalization error SGNE. An up/down counter 20 performs "statistic process" by integration with respect to time by being supplied with an up and down signals, thereby extracting only the precursor interference. The output of the up/down counter 20 is decoded by a decoder 21. The decoder 21 operates to select by its output one of capacitors 13-1 which have been prepared in advance. It selects a large capacitance $C_1$ for a positive residual precursor interference or selects a smaller capacitance $C_1$ for the negative, thereby working as an adaptive precursor equalizer.

Another method of implementing the adaptive control for the capacitor 13-1 uses information of the $\sqrt{f}$ equalizer. This method utilizes that an increasing deviation from the actual line characteristics and an increasing precursor interference result from a larger amplification of the $\sqrt{f}$ equalizer, and operates to add a capacitor 13-1 when the amplification exceeds a certain value or remove the capacitor $C_1$ at an amplification below the value, thereby choosing as to whether the precursor interference be eliminated basing on the assumption of a predetermined precursor interference.

According to this invention, the precursor equalizing filter is configured as a first-order filter in the form of a switched capacitor circuit, whereby an accurate LSI-based line equalizer can be realized in a very simple circuit arrangement. Especially, an analog multiplier is replaced with simple switched capacitors to accomplish the same multiplying function, and the equalizing filter and automatic decision feedback equalizer can share a common circuit for their adding functions, whereby the circuit arrangement is further simplified.

We claim:
1. A line equalizer comprising:
   an input terminal (1) to which a pulse signal having a transmission fundamental period of T is inputted;
   a delay element (2), connected with said input terminal, for delaying said input pulse signal by a period of T;
   a coefficient multiplier (4), connected with said input terminal, for multiplying said input pulse signal by a coefficient a;
   an adder (3-1) for addng an output from said delay element and an output from said multiplier; and
   a decision circuit (8) for deciding an output pulse signal from said adder for each period T which includes a first comparator (8-1) for generating a first pulse signal when said output pulse signal exceeds a positive predetermined value, a second comparator (8-2) for generating a second pulse signal when said output pulse exceeds a negative predetermined value, a first logic element (8-3) for generating a third pulse signal when both of said first and second pulse signals are generated, a second logic element (8-4) for generating a fourth pulse signal when both of said first and second pulse signals are not generated, and a third logic element (8-5) for generating a fifth pulse signal obtained by a combination of said third and fourth pulse signals to an output terminal;
   an error signal decision circuit (3-2) for generating a residual equalizing error on the basis of said third and fourth pulse signals and the output pulse signal from said adder;
   a first control circuit (9) for sending a postcursor signal to said adder on the basis of said third and fourth pulse signals and said residual equalizing error; and
   a second control circuit (10) for changing the coefficient a of said multiplier on the basis of a signal obtained by delaying said residual equalizing error by the period T and said third and fourth pulse signals,
   wherein said delay element (2), said coefficient multiplier (4) and said adder (3-1) constitute a precursor equalizer and said adder (3-1) and said first control circuit (9) constitute a postcursor equalizer.

2. A line equalizer according to claim 1 wherein said error signal decision circuit comprising:
   a reference voltage source to select a predetermined voltage source from a plurality of voltage sources having at least an upper limit voltage value, a lower limit voltage value, and zero voltage value; and
   a comparator which produces the residual equalizing error when the output pulse signal from said adder exceeds the voltage value of said reference voltage source.

3. A line equalizer according claim 1, where in said precursor equalizer comprises:
   said coefficient multiplier operated by a first clock signal having the same period as said fundamental period T;
   said delay circuit having a first switched capacitor and a second switched capacitor which are connected in parallel with said coefficient multiplier;
   said first switched capacitor being controlled by a third clock signal having a period twice said fundamental period T and said second switched capacitor being controlled by a fourth clock signal, having a period twice said fundamental period T and delayed in phase from said third clock signal by the period T;
   said adder including an operational amplifier having a positive input terminal grounded and having a connection of a third switched capacitor between a negative input terminal and output terminal thereof; and
   a switch connected across said third switched capacitor and operated by a second clock signal having the same period as said fundamental period T.

* * * * *